(12) United States Patent
Froehlich et al.

(10) Patent No.: US 8,476,974 B2
(45) Date of Patent: Jul. 2, 2013

(54) DIFFERENTIAL AMPLIFIER AND METHOD FOR THE OPERATION OF A DIFFERENTIAL AMPLIFIER

(75) Inventors: Thomas Carl Froehlich, Wattwil (CH); Wolfgang Duenser, Rapperswil-Jona (CH)

(73) Assignee: AMS AG, Unterpremstaetten (AT)

( * ) Notice: Subject to any disclaimer, the term of this patent is extended or adjusted under 35 U.S.C. 154(b) by 146 days.

(21) Appl. No.: 13/069,109

(22) Filed: Mar. 22, 2011

(65) Prior Publication Data

US 2011/0227652 A1  Sep. 22, 2011

(30) Foreign Application Priority Data

Mar. 22, 2010 (DE) .......................... 10 2010 012 269

(51) Int. Cl.
*H03F 3/45* (2006.01)
(52) U.S. Cl.
USPC ................................. 330/69; 330/260; 330/86
(58) Field of Classification Search
USPC ............................................. 330/69, 260, 86
See application file for complete search history.

(56) References Cited

U.S. PATENT DOCUMENTS

| | | | |
|---|---|---|---|
| 3,541,349 A * | 11/1970 | Bright et al. | 327/138 |
| 3,624,491 A | 11/1971 | Fidi | |
| 4,206,416 A * | 6/1980 | Kellogg | 330/69 |
| 4,396,890 A * | 8/1983 | Kato et al. | 330/86 |
| 4,462,008 A | 7/1984 | Katakura | |
| 4,491,802 A * | 1/1985 | Uchida et al. | 330/260 |
| 4,506,113 A | 3/1985 | Blomley | |
| 4,574,249 A * | 3/1986 | Williams | 330/59 |
| 4,877,981 A | 10/1989 | Gomes | |
| 5,210,503 A | 5/1993 | Sawamura | |
| 5,631,968 A | 5/1997 | Frey et al. | |
| 5,862,238 A | 1/1999 | Agnew et al. | |
| 7,389,087 B2 * | 6/2008 | Darabi et al. | 455/20 |
| 7,701,284 B2 * | 4/2010 | Liao et al. | 330/69 |
| 2008/0036540 A1 | 2/2008 | Frohlich et al. | |
| 2009/0058519 A1 | 3/2009 | Nishimura | |
| 2009/0136061 A1 | 5/2009 | Osborne | |
| 2010/0148876 A1 | 6/2010 | Frohlich et al. | |

FOREIGN PATENT DOCUMENTS

DE        32 48 552     7/1983
DE   10 2007 011 715   9/2008

* cited by examiner

*Primary Examiner* — Patricia Nguyen
(74) *Attorney, Agent, or Firm* — McDermott Will & Emery LLP

(57) ABSTRACT

A differential amplifier comprises a first amplifier (A1) with a signal input (Inp) and a signal output (Out1) that is fed back to a first feedback input (In1) of the first amplifier (A1) and is also connected to a first output (outp) of the differential amplifier. Furthermore, a buffer circuit (Buff) is connected to the first output (outp). A nonlinear resistor circuit (Rnl1, Rnl2) is coupled via a first output node (Vmid1) with the first output (outp) and via a second output node (Vmid2) with the buffer circuit (Buff).

10 Claims, 3 Drawing Sheets

DIFFERENTIAL AMPLIFIER AND METHOD FOR THE OPERATION OF A DIFFERENTIAL AMPLIFIER

RELATED APPLICATIONS

This application claims the priority of German application no. 10 2010 012 269.6 filed Mar. 22, 2010, the entire content of which is hereby incorporated by reference.

FIELD OF THE INVENTION

The present invention relates to a differential amplifier and to a method for the operation of a differential amplifier.

BACKGROUND OF THE INVENTION

Differential amplifiers and special instrumentation amplifiers are used for the amplification of a wide array of signals in broad fields of application. As microphone amplifiers, they combine low noise with a high dynamic range. Audio applications alone require such high dynamic ranges on the order of magnitude of 100 dB. In contrast, in mobile applications, such as, for example, in hearing aids and cellular telephones, the power supply voltage typically equals 1.6 V and thus limits the maximum achievable signal amplitude to approximately 1.4 V (Peak to Peak). This corresponds to an amplitude of approximately 1 Vrms. Due to ongoing miniaturization, it is to be expected that the power supply voltages in the future must be reduced even further.

In most applications, it is now necessary that a preamplifier features a large signal amplification. In this way, the noise of the subsequent stages is suppressed, which has advantageous effects for all of the subsequent signal processing steps. The amplification is typically implemented with variable amplification factors from 3-100. In order to simultaneously fulfill the requirements on amplification, dynamic range, and variable signal amplitudes and in this way keep distortion for large signal amplitudes as small as possible, it is necessary to provide an amplification compression or an automatic gain control (AGC) circuit in the preamplifier.

SUMMARY OF THE INVENTION

One object of the present invention is to provide a differential amplifier that allows a higher dynamic range for simultaneously low signal amplitude.

In one embodiment, a differential amplifier comprises a first amplifier with a signal input and a signal output that is fed back to a first feedback input of the first amplifier and is also connected to a first output of the differential amplifier. Furthermore, a buffer circuit is connected to the first output. A nonlinear resistor circuit is coupled via a first output node with the first output and via a second output node with the buffer circuit.

At the signal input of the first amplifier, an input signal is applied, such as, for example, a microphone signal of a hearing aid. The differential amplifier makes available, according to a set amplification factor, an output signal as a function of the input signal applied to the signal input. The output signal is provided on the first output of the differential amplifier. The amplification factor with which the output signal is amplified from the input signal is determined by two feedback loops.

The first feedback loop leads from the signal output of the first amplifier via the nonlinear resistor circuit to the first feedback input of the first amplifier. The amplification factor of the differential amplifier is determined as a function of the resistance that is specified by the nonlinear resistor circuit. The resistance of the nonlinear resistor circuit is here defined by a nonlinear characteristic line and depends, in turn, on the signal amplitude of the corresponding input signal.

The second feedback loop leads from the signal output of the first amplifier via the buffer circuit back to the first amplifier. On the second output node of the nonlinear resistor circuit, a changing potential that can be used as a virtual reference potential for the differential amplifier is set as a function of the output signal.

Advantageously, it is possible, through use of the first feedback loop or the nonlinear resistor circuit, to adjust the amplification factor of the differential amplifier dynamically as a function of the input signal. Thus, for example, the amplification factor can be adjusted so that it becomes smaller with increasing amplitudes of the input signal, and thus an overload is prevented. Accordingly, it then behaves conversely for signal amplitudes becoming smaller. The functional relationship between the amplitude of an input signal and the amplification factor is designated below with the expression of a characteristic line. Through an adjustment of the amplification factor, an expansion of the dynamic range of the differential amplifier is achieved at given small-signal amplification.

It is possible to achieve an adaptive reduction of the amplification of the differential amplifier for large signal amplitudes through the nonlinear resistor circuit or its nonlinear characteristic line. This is especially advantageous in applications in which the amplifier must amplify input signals within a large dynamic range. Such applications occur especially in hearing aids and cellular telephones. With the help of the second feedback loop, larger and undesired signal fluctuations can be compensated and a reference potential can be set on the second output node.

As the first amplifier, different amplifier types could be used here. It is advantageous, however, when the signal input of the first amplifier is high-impedance. In addition, the differential amplifier could comprise one or also several nonlinear resistor circuits.

In another embodiment, the buffer circuit has a second amplifier with a reference input and a reference output, wherein the reference output is fed back to a second feedback input of the amplifier. In addition, the second amplifier is connected to a second output of the differential amplifier. Furthermore, the nonlinear resistor circuit is coupled via the second output node with the second output. The nonlinear resistor circuit is also connected to the first feedback input and to the second feedback input.

The differential amplifier has available, according to the set amplification factor, two output signals as a function of the input signal applied to the signal input. The first output signal is provided on the first amplifier output, and the second output signal is provided on the second amplifier output. The amplification factor with which the first or second output signal is amplified from the input signal is determined by two feedback loops.

The first feedback loop now leads from the signal outputs of the first and second amplifier via the nonlinear resistor circuit to the first and second feedback input of the first and second amplifier. The second feedback loop is realized from the signal outputs of the first and second amplifiers via the reference input of the second amplifier. As a function of the first and second output signals that are applied to the first amplifier output and to the second amplifier output, a reference signal is fed to the reference input of the second amplifier.

In another embodiment, the nonlinear resistor circuit comprises a first component that comprises a first resistor and a first transistor. The first resistor and the first transistor are connected parallel to each other and are coupled, on one hand, via a first output node with the first amplifier output and, on the other hand, via another resistor and a second output node with the second amplifier output. For the control of the component, a bias current can be fed to the control side of the first transistor.

The nonlinear resistor circuit allows an adaptive amplification reduction. In this sense, adaptive means an adjustment of the amplification factor of the differential amplifier as a function of an input signal that is also limited by an upper amplification factor. A suitable input signal is, in particular, a voltage, for example, of a microphone in a hearing aid. As a function of this input signal, the current changes in the operation of the first transistor. This happens in a linear way with increasing signal amplitude until the transistor is brought into a saturation region. If the signal amplitude of the input signal rises further and the first transistor is located in the saturation region, then the current of the nonlinear resistor circuit and thus the amplification factor of the differential amplifier are limited.

Advantageously, an adjustment of the amplification factor can be performed with the help of the nonlinear resistor circuit or the first transistor and first resistor according to a nonlinear characteristic line. The amplification factor is limited with increasing signal amplitude or voltage on the signal input of the first amplifier. A lower limit of the amplification factor is here defined by the saturation of the first transistor. An upper limit of the amplification factor is defined in the first order by the sum from the resistance value of the additional resistor and the conducting-state resistance of the first transistor. For example, an adaptive amplification reduction is realized with a few components that could also be integrated. By feeding a bias current to the first transistor, it can be further controlled at which signal amplitude or current intensity on the signal input the saturation of the first transistor is set.

In another embodiment, the nonlinear resistor circuit comprises a second component such that a second transistor is connected parallel to the first resistor connected in series and the second resistor. The second resistor is coupled via a third resistor with the second output node. For the control of the second component, a bias current can be fed to the control side of the second transistor.

If an input signal is applied to the input of the differential amplifier, then a current flows, for example, first through the second transistor. If the signal amplitude of the input signal increases, then the current flow through the second transistor changes up to the point at which it leaves its linear region and moves into the saturation region. At this point, the current likewise begins to flow through the first resistor and the first transistor. The total resistance of the nonlinear resistor circuit is therefore increased. If the signal amplitude increases further, then this has the result that more current flows through the first transistor until this also moves into the saturation region. The resistance of the nonlinear resistor circuit accordingly increases further, and the amplification factor of the differential amplifier is further reduced.

Advantageously, through the use of the first and second transistors, a characteristic line is achieved that is combined from two linear regions. At each of the points at which one of the two transistors moves into the saturation region, a transition occurs in the characteristic line between the linear regions, wherein this transition, however, is not abrupt, but instead is realized continuously. Even for use in hearing aids, a pleasant hearing sensation for the user can be achieved, because larger and sudden jumps in the amplification are avoided.

In another embodiment, the nonlinear resistor circuit comprises a number n of components such that each n-th transistor is connected parallel to a series circuit made from n−1 resistors. The (n−1)-th resistor is coupled via an n-th resistor with the second output node. For the control of the n-th component, a bias voltage can be fed to the control side of the n-th transistor.

According to the amplitude of an input signal, a current flows, for example, first through the n-th transistor and this is in its linear region. With increasing signal amplitude or current intensity, the n-th transistor finally moves into the saturation region, and the (n−1)-th transistor is open and in its linear region. With further increasing signal amplitude, this transistor finally also moves into the saturation region. This change between current flow of successively following transistors continues as a function of the number of transistors and determines the resistance value of the nonlinear resistor circuit. On the other hand, the resistance value finally determines the amplification factor of the differential amplifier.

Advantageously, a nonlinear characteristic line can be divided into additional linear sections for the determination of the amplification factor of the differential amplifier. These sections correspond to the number of pairs of transistor and resistor. The actual appearance of the characteristic line can be adjusted as a function of the geometry of the transistors and corresponding resistors.

In another embodiment, a reference transistor is connected to the first output or to the first output node. A bias current can be fed to the control side and load side of the reference transistor.

The reference transistor is used for the nonlinear resistor circuit as a reference whose control side is provided, like load side, with a bias current. The transistors of the nonlinear resistor circuit represent, to a certain extent, current limiters. The degree of current limitation is determined by the geometric ratio of the transistors in comparison with the reference transistor, as well as by the bias current. Advantageously, the characteristic line of the nonlinear resistor circuit can be adjusted with the help of the reference transistor.

Alternatively, more than one reference transistor could also be used. Preferably, however, the number of reference transistors does not increase the number of transistors being used in the nonlinear resistor circuit.

In another embodiment, an adjustment circuit adjusts the bias current such that processing and temperature variations of the nonlinear resistor circuit can be compensated continuously.

Processing fluctuations in the production of components of the differential amplifier, as well as temperature fluctuations during the operation, result in fluctuations in the characteristic line of the nonlinear resistor circuit. These can be compensated by a changing of the bias current by the adjustment circuit.

In another embodiment, the adjustment circuit comprises an auxiliary amplifier with a first input, a second input, and a reference output. A first reference current source is connected to the first input and a second reference current source is connected to the second input. A supply voltage can be connected to the first and second reference current source. Furthermore, the adjustment circuit comprises a reference resistor that is connected to the first input. A first reference transistor is coupled via its load side with the reference resistor and the second input and is connected via its control side to the reference output. A second reference transistor is coupled via its load side with the reference resistor and with a current mirror that generates the bias current. The second reference transistor is connected to the reference output via its control side.

In typical fields of application of the differential amplifier, it is necessary to keep the nonlinear characteristic line constant across temperature and processing variations. This is realized by a suitable provision of a bias current with the help of the adjustment circuit. The adjustment circuit changes the bias current through the first and second reference transistor such that its resistance follows the resistance of the reference resistor. The reference resistor is preferably selected so that its resistance value corresponds to the total of n resistors of the nonlinear resistor circuit or is set in a fixed ratio to this value. The first reference transistor is preferably likewise selected so that it corresponds to the transistors of the nonlinear resistor circuit or is set in a fixed ratio to this value.

In another embodiment, the first amplifier output and the second amplifier output are combined by a converter circuit to a combined output, and the combined output is connected to the reference input of the second amplifier.

Advantageously, the converter circuit allows a so-called differential-to-single-ended conversion, i.e., a conversion of a signal that can be guided on two lines into a signal that can be guided on one line, and allows the feedback of a combined output signal to the reference input.

In another embodiment, a filter is coupled between the first amplifier output and the buffer circuit.

With the help of the filter, for example, a DC signal can be fed back to the reference input. With the help of the feedback and the filter, signal fluctuations can be compensated, and the differential amplifier can be stabilized overall. Thus, for example, DC components of the input signal that change with a low frequency are compensated on the input node. The filter can be, for example, an RC element or, in combination of the converter circuit with a capacitor, a so-called gmC filter (gm: transconductance).

In another embodiment, all of the transistors in the differential amplifier are constructed as unipolar transistors.

Advantageously, the differential amplifier can be constructed using CMOS technology and can also be realized with low noise performance.

In one embodiment, a method for the operation of a differential amplifier comprises an amplification of an input signal with an amplification factor. Furthermore, the method comprises a comparison of the amplified signal with a reference signal and an adjustment of the amplification factor according to a nonlinear characteristic line as a function of the comparison. Consequently, an input signal is amplified with the adjusted amplification factor.

Advantageously, it is possible to adjust the amplification factor of a differential amplifier dynamically as a function of the input signal through the comparison of the amplified signal with a reference signal. Thus, for example, the amplification factor can be adjusted so that it becomes smaller with increasing amplitudes of the input signal and thus prevents an overload. Correspondingly, it then behaves conversely for signal amplitudes becoming smaller. In this way, it is possible to realize an adaptive amplification reduction. This is especially advantageous in applications in which the amplifier must amplify input signals within a large dynamic range. Such an application occurs especially in microphone applications.

In another embodiment of the method, the nonlinear characteristic line is combined from at least two linear characteristic lines. The adjustment of the amplification factor takes place according to one of the at least two linear characteristic lines and as a function of the comparison.

Advantageously, a characteristic line is achieved that is combined from two linear regions. This is performed preferably not abruptly, but instead continuously at each of the transitions between the linear regions. Just for use of the method with a differential amplifier in hearing aids, a pleasant hearing sensation can be achieved for the user, because larger and sudden jumps in the amplification can be avoided. The functional context of the characteristic line can be adjusted with a view to an actual application.

In another embodiment, the method comprises a nonlinear characteristic line that is combined from a number of n linear characteristic lines. The adjustment of the amplification factor takes place according to one of the n linear characteristic lines and as a function of the comparison.

Through additional n linear characteristic lines, the characteristic line can be combined section by section from linear regions. This allows further flexibility in adjusting the characteristic line to an actual application, for example, in a hearing aid. Here, the transitions between the linear regions could be constructed, in turn, continuously.

In another embodiment, the method comprises a comparison with a reference. The nonlinear characteristic line is here modified as a function of this comparison with the reference so that processing and temperature fluctuations are compensated.

This leads to fluctuations in the characteristic line as a result of processing fluctuations in the production of the components of the differential amplifier, as well as temperature fluctuations during the operation. These could be compensated through comparison with a reference in that, for example, the differential amplifier is supplied with a variable bias current.

BRIEF DESCRIPTION OF THE DRAWINGS

Elements with the same or similar function or action are designated by the same reference symbols.

DETAILED DESCRIPTION OF THE DRAWINGS

Figure 1:
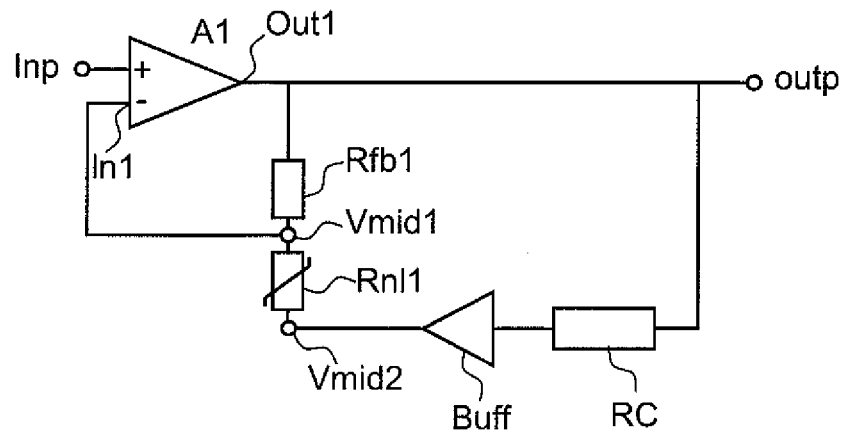
FIG. 1 shows an embodiment of a differential amplifier according to the invention.

FIG. 1 shows a differential amplifier according to an embodiment of the invention. A first amplifier A1 comprises a signal input Inp and a signal output Out1. The signal output Out1 is fed back via a first feedback resistor Rfb1 to a first feedback input In1 of the first amplifier A1 and is connected to a first output outp of the differential amplifier. A first nonlinear resistor circuit Rnl1 is connected via a first output node Vmid1 to the first feedback resistor Rfb1 and via a second output node Vmid2 to a buffer circuit Buff. A filter RC is coupled between the buffer circuit Buff and the first output outp of the differential amplifier.

A voltage is applied to the signal input of the first amplifier A1, for example, via a microphone. This voltage is amplified corresponding to an amplification factor A of the differential amplifier and made available on the first output outp. The amplification factor A and, in general, the amplification characteristics of the differential amplifier are here defined by two feedback loops.

A first feedback loop comprises the first feedback resistor Rfb1 and the nonlinear resistor circuit Rnl1. This first feedback defines an adaptive amplification reduction of the differential amplifier and is explained in detail with reference to the following figures.

The second feedback loop leads via the first output outp and via the filter RC to the buffer circuit Buff. In this way, a signal that is applied to the first output outp of the differential amplifier is fed back amplified and suppresses low-frequency components on the first output outp. Here, the filter could be constructed as an RC element or as a gm-C filter (gm: transconductance). In addition, a dynamically variable potential is set on the second output node Vmid2. The potential is here defined by the signal applied on the signal input of the first amplifier A1 as well as a possible offset of the first amplifier A1 and can be used as a reference potential for the differential amplifier.

Advantageously it is possible to adjust, through use of the first feedback loop or the nonlinear resistor circuit Rnl1, the amplification factor A of the differential amplifier dynamically as a function of the input signal. Thus, for example, the amplification factor A can be adjusted so that it becomes smaller with increasing amplitude of the input voltage and thus prevents an overload. Accordingly, it then behaves conversely for signal amplitudes becoming smaller. Through an adjustment of the amplification factor A, an operation of the differential amplifier with a high dynamic range is also achieved for small signal amplitudes.

It is possible to realize an adaptive amplification reduction through the nonlinear resistor circuit Rnl1 or its nonlinear characteristic line. This is especially advantageous in applications in which the amplifier must amplify input signals within a large dynamic range. Such an application occurs especially in hearing aids and cellular telephones. With the help of the second feedback loop, larger, undesired, and low-frequency signal fluctuations could be compensated.

Figure 2:
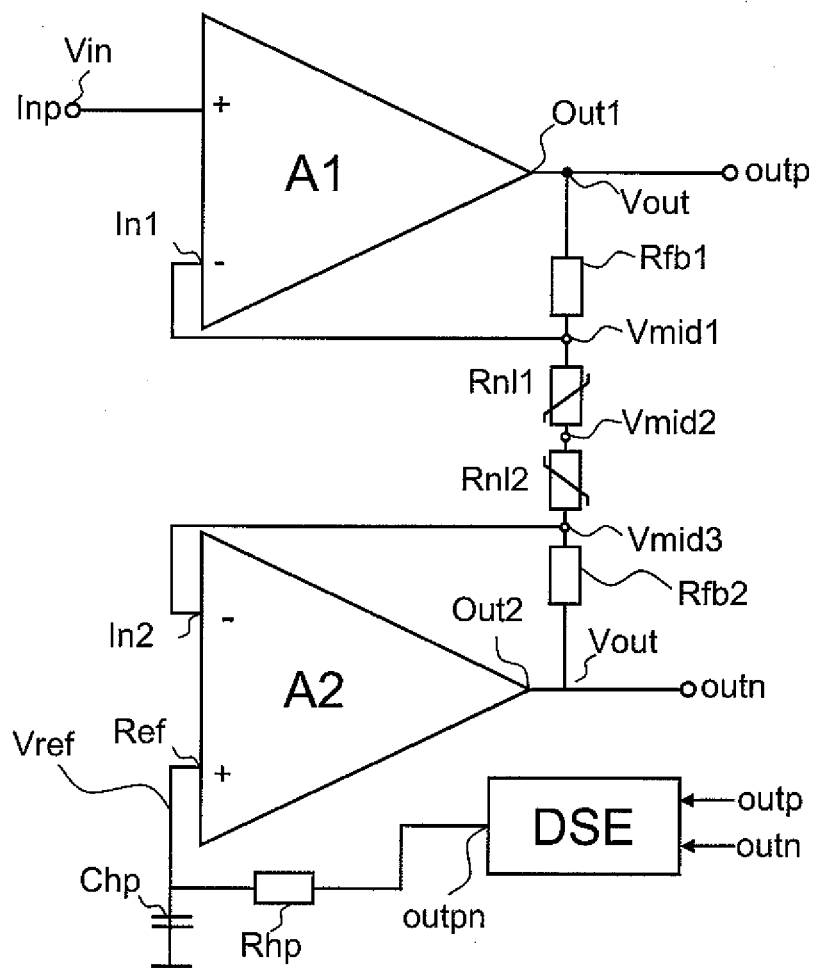
FIG. 2 shows an embodiment of a differential amplifier with a first and second amplifier according to the invention.

FIG. 2 shows an embodiment of a differential amplifier with a second amplifier A2 according to the invention. The second amplifier A2 comprises a reference input Ref and a reference output Out2 that is fed back to a second feedback input In2 via a second feedback resistor Rfb2. The reference output Out2 is connected to a second output outn of the differential amplifier.

The first nonlinear resistor circuit Rnl1 is connected via the second output node Vmid2 to a second nonlinear resistor circuit Rnl2. The second nonlinear resistor circuit Rnl2 is coupled via a third output node Vmid3 with the second feedback resistor Rfb2 and the feedback input In2. The first and second output outp, outn of the differential amplifier is also applied to a converter circuit DSE. The converter circuit DSE is coupled via a combined output outpn with an RC filter Rhp, Clip. The RC filter Rhp, Chp comprises a filter resistor Rhp that is connected both to the reference input Ref of the second amplifier A2 and also via a filter capacitor Chp to ground GND.

The amplification factor A and, in general, the amplification characteristics of the differential amplifier are here defined by two feedback loops. The first feedback loop now comprises the first and second feedback resistors Rfb1, Rfb2 and the first and second nonlinear resistor circuit Rnl1, Rnl2. This first feedback defines an adaptive amplification limit of the differential amplifier and will be explained in detail with reference to the FIGS. 3a, 3b.

The second feedback loop feeds back via the first and second output outp, outn via the converter circuit DSE and the RC filter Rhp, Chp to the reference input of the second amplifier A2. In this way, a signal that is applied to the outputs outp, outn is fed back amplified and low-frequency components are fed to the non-inverting reference input Ref of the second amplifier A2 and thus suppressed on the first and second output outp, outn. Converter circuit DSE is of a well known type implementing differential to single ended conversion.

Alternatively, the filter resistor Rhp and the converter circuit DSE could be combined and form, together with the filter capacitor Chp, a gm-C filter (gm: transconductance).

Figure 3A:
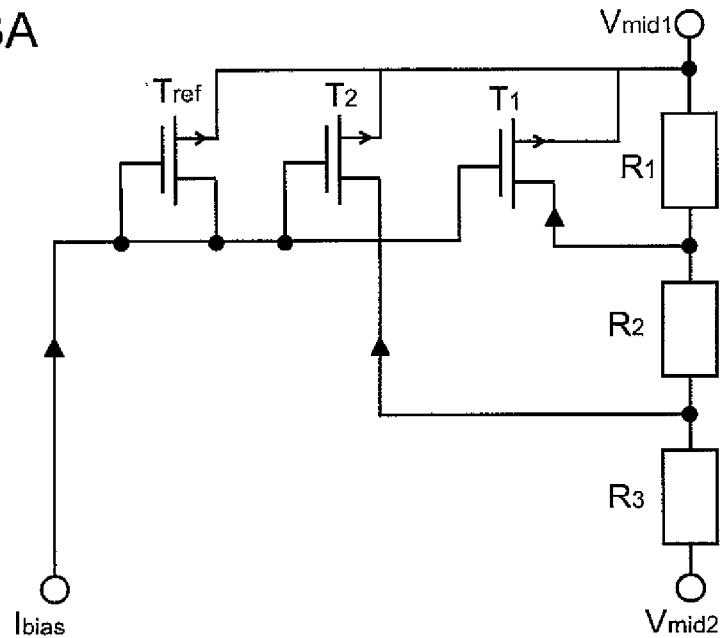
FIG. 3a shows an embodiment of a nonlinear resistor circuit with two components according to the invention.

FIG. 3a shows an embodiment of a nonlinear resistor circuit Rnl1, Rnl2 with two components according to an embodiment of the invention. The nonlinear resistor circuit Rnl1, Rnl2 here comprises a first component that comprises a first resistor R1 and a first transistor T1 that are connected parallel to each other and are connected to the first output node Vmid1 and a second resistor R2. The second resistor R2 is further connected in parallel to a second transistor T2 that is connected in turn to the output node Vmid1. The parallel circuit made from the second transistor T2 and second resistor R2 is connected via a third resistor R3 to the second output node Vmid2. The control side of the first transistor T1 and the second transistor T2 are provided with a bias current (bias. In addition, the nonlinear resistor circuit Rnl1, Rnl2 comprises a reference transistor Tref that is connected to the first output node Vmid1 and on whose control side and load side the bias current (bias is applied.

Alternatively, the first and the second output node Vmid1, Vmid2 can be exchanged.

The voltage that drops across the nonlinear resistor circuit Rnl1, Rnl2 is defined as half the voltage difference between the signal input Inp and the voltage on the reference input Ref. The amplification factor A of the differential amplifier is defined by means of the ratio from the resistance of the feedback resistor Rfb1 Rfb2 and the resistance of the nonlinear resistor circuit Rnl1, Rnl2:

$$A = 1 + \left(\frac{Rfb1 + Rfb2}{Rnl1 + Rnl2}\right),$$

wherein Rfb1, Rfb2 designate the first and second feedback resistance. For small signals, the resistance of the nonlinear resistor circuit Rnl1, Rnl2 is given from the sum of the resistors of the parallel circuit made from the (conducting state) resistance of the second transistor T2 with the resistance value of the inner circuit (made from first resistor R1, second resistor R2, and the first transistor T1) plus the resistance value of the third resistor R3. The first and the second transistors T1, T2 take over the role of a current limiter, wherein the degree of current limiting can be derived from the geometric ratio from the transistors T1, T2 and the reference transistor Tref, as well as from the bias current Ibias.

With increasing signal amplitude on the signal input Inp, the current flow through the second transistor T2 is amplified until this leaves its linear range and moves into the saturation range. At this point, the second transistor T2 becomes nonconductive and current begins to flow through the second resistor R2 and the first transistor T1. The total resistance of the nonlinear resistor circuit Rnl1, Rnl2 therefore increases. If the signal amplitude on the signal input Inp increases further, then the first transistor T1 also leaves its linear region and moves into the saturation range. The resistance of the nonlinear resistor circuit Rnl1, Rnl2 here increases further until the first transistor T1 also moves into the saturation region. With increasing resistance of the nonlinear resistor circuit Rnl1, Rnl2, the amplification factor A of the differential amplifier is reduced.

In this way, a section-by-section linear characteristic line can be generated, and the amplification factor A can be regulated adaptively. An overload is thus prevented. The nonlinear characteristic line is here defined by the transistor geometries and the resistors being used. It is further advantageous that transitions between the linear sections of the characteristic line are performed continuously and not abruptly due to the use of the first and second transistors T1, T2. Just for use of the nonlinear resistor circuit Rnl1, Rnl2 in a hearing aid, this allows a pleasant hearing sensation also for greatly changing input signals.

Figure 3B:
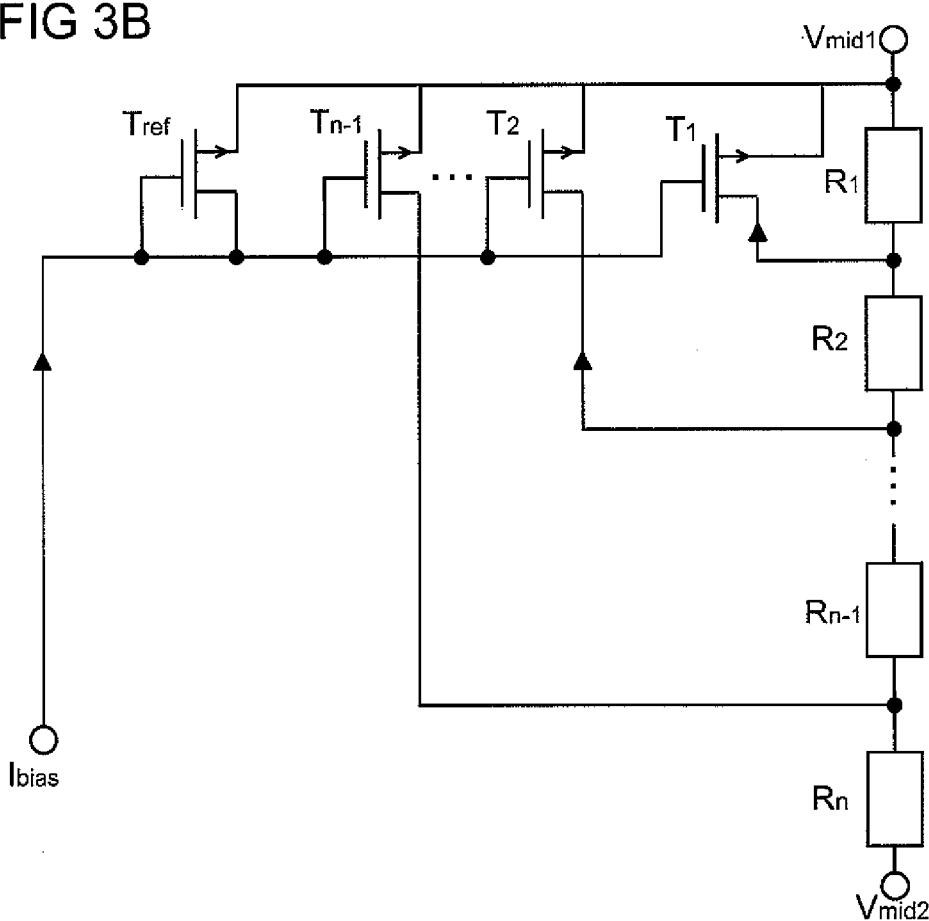
FIG. 3b shows an embodiment of a nonlinear resistor circuit with a number of n components according to the invention.

FIG. 3b shows an embodiment of a nonlinear resistor circuit Rnl1, Rnl2 with a number of (n−1) components according to the proposed principle. Here, each component designates a pair of corresponding resistors and transistors, for example, the first resistor R1 and the first transistor T1, etc. The nonlinear resistor circuit Rnl1 Rnl2 can be realized with (n−1) such components. For this purpose, the (n−1) resistors R1, Rn−1 are connected in series. Here, Rn−1 designates the (n−1)-th resistor. Each corresponding transistor T1, ..., Tn−1 is connected parallel to the series circuit R1, ..., Rn−1, i.e., the first transistor T1 is connected parallel to R1, the second transistor T2 parallel to the series from the first and second resistor R1, R2, etc. The n-th resistor Rn is connected to the first output node Vmid1.

Advantageously, it is possible to define additional linear sections in the characteristic line. These sections correspond to the number of pairs from transistors T1, ..., Tn−1 and resistors R1, Rn−1. The actual appearance of the characteristic line can be adjusted as a function of the geometry of the transistors T1, ..., Tn−1 and the corresponding resistors R1, Rn.

Figure 4:
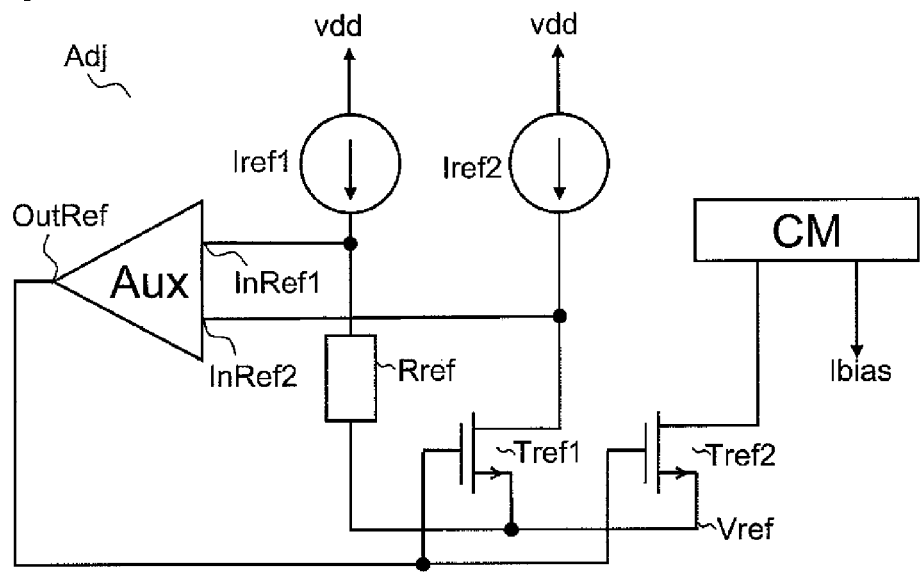
FIG. 4 shows an embodiment of an adjustment circuit according to the invention.

FIG. 4 shows an adjustment circuit according to an embodiment of the invention. The adjustment circuit Adj comprises an auxiliary amplifier Aux with a first input Inref1, a second input Inref2, and a reference output Outref. A first reference current source Iref1 is connected to the first input Inref1 and to a second reference current source Iref2 that is connected to the second input Inref2. The first and second reference current sources Iref1, Iref2 are connected to a supply voltage Vdd. A reference resistor Rref is connected to the first input Inref1 and to a reference voltage Vref. A first reference transistor Tref1 is coupled via its load side with the reference voltage Vref and the second input Inref2. The first reference transistor Tref1 is also connected via its control side to the reference output Outref. A second reference transistor Tref2 is coupled via its load side with the reference voltage Vref and with a current mirror CM that generates the bias current Ibias. The second reference transistor Tref2 is further connected via its control side to the reference output Outref. By means of the current mirror CM, the adjustment circuit Adj is coupled with the nonlinear resistor circuit Rnl1, Rnl2 or to the control sides of the transistors T1, ..., Tn−1.

In typical applications of the differential amplifier, it is necessary to keep the nonlinear characteristic line constant across temperature and processing variations. This is achieved through a adjustment circuit Adj. The adjustment circuit Adj changes a reference bias current that is applied to the control side of the first reference transistor Tref1 such that its resistance follows the resistance of the reference resistor Rref in the operation of the circuit. This is made possible by the auxiliary amplifier Aux that controls, with the help of the two reference current sources Iref1, Iref2 or by means of the reference output Outref, the first reference transistor Tref1, so that, in operation of the circuit, its resistance corresponds to the reference resistor Rref. The reference resistor Rref is preferably selected so that its resistance value is in a fixed ratio to each value of the total of n resistors Rn of the nonlinear resistor circuit Rnl1 Rnl2. The first reference transistor Tref1 is preferably also selected so that it is in a fixed ratio to the transistors T1, Tn of the nonlinear resistor circuit Rnl1, Rnl2. Finally, by means of the second reference transistor Tref2, a compensation current is set and the current mirror CM is controlled. This then generates the bias current Ibias that is fed to the nonlinear resistor circuit Rnl1, Rnl2.

Advantageously, a reference for the nonlinear resistor circuit Rnl1, Rnl2 can be realized with the adjustment circuit Adj that has the result that the characteristic line is, to the greatest possible extent, independent of temperature, supply voltage, and processing variations. The bias current Ibias used for this purpose is adjusted continuously, without an external means, such as, for example, a user being necessary. Just in audio applications, the soft, i.e., continuous amplification transitions lead to a pleasant hearing sensation.

Figure 5:
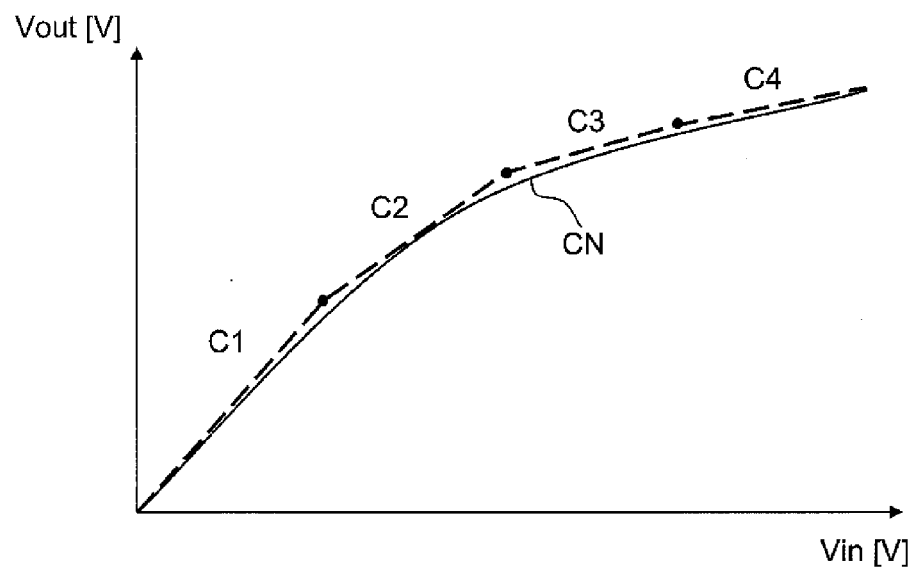
FIG. 5 shows a nonlinear characteristic line according to the invention.

FIG. 5 shows a nonlinear characteristic line according to an embodiment of the invention. Plotted is the output voltage Vout versus an input signal Vin. The characteristic line is taken as a function Vout(Vin). As an example, the case is shown that the nonlinear characteristic line Vout(Vin) is produced from four linear characteristic lines C1, C2, C3, C4. These are taken, as shown with reference to FIGS. 3a and 3b, from the number of corresponding transistors T1, ..., Tn−1 and resistors R1, ..., Rn−1. The dashed curve is taken from the ratios as produced from the resistors used in the circuit of the differential amplifier. On the other hand, the curve set forth also takes into consideration the real performance as a result of the resistor properties of the installed transistors. In particular, a continuous curve is produced without significant jumps or discontinuities. This is especially advantageous and leads, in audio applications of the differential amplifier (for example, in a hearing aid), to a pleasant hearing sensation in environments with greatly fluctuating signal amplitudes.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A differential amplifier comprising:
   a first amplifier with a signal input and a signal output that is fed back to a first feedback input of the first amplifier and is connected to a first output of the differential amplifier;
   a buffer circuit that is connected to the first output; and
   a nonlinear resistor circuit that is coupled via a first output node to the first output and via a second output node to the buffer circuit,
   wherein the nonlinear resistor circuit comprises a first component that comprises a first resistor and a first transistor that are connected to each other in parallel and are coupled, on one hand, to the first output node and, on the other hand, via a second resistor to the second output node and a bias current can be fed to the control side of the first transistor for controlling the component.

2. The differential amplifier according to claim 1, wherein the buffer circuit comprises:

a second amplifier with a reference input and a reference output that is fed back to a second feedback input of the second amplifier and is connected to a second output of the differential amplifier; and the nonlinear resistor circuit is coupled via the second output node to the second output and is connected to the first feedback input and to the second feedback input.

3. The differential amplifier according to claim 1, wherein the nonlinear resistor circuit comprises a second component such that:

a second transistor is connected parallel to the first resistor connected in series and second resistor;

the second resistor is coupled via a third resistor to the second output node; and the bias current can be fed to the control side of the second transistor for the control of the second component.

4. The differential amplifier according to claim 1, wherein the nonlinear resistor circuit comprises a number n of components such that:

each (n−1)-th transistor is connected parallel to a series circuit made from n−1 resistors, each (n−1)-th resistor (Rn−1) is coupled via an n-th resistor (Rn) with the second output node, and the bias current can be fed to the control side of the (n−1)-th transistor for the control of the n-th component.

5. The differential amplifier according to claim 1, wherein a reference transistor is connected to the first amplifier output or to the first output node and the bias current can be fed to its control side and load side.

6. The differential amplifier according to claim 1, that comprises an adjustment circuit that adjusts the bias current such that process and temperature variations of the nonlinear resistor circuit are compensated continuously.

7. The differential amplifier according to claim 6, wherein the adjustment circuit comprises:

an auxiliary amplifier with a first input, a second input, and a reference output;

a first reference current source that is connected to the first input and a second reference current source that is connected to the second input and each of which can be connected to a supply voltage;

a reference resistor that is connected to the first input and a reference voltage;

a first transistor that is coupled via its load side with the reference voltage and the second input and is connected via its control side to the reference output; and a second transistor that is coupled via its load side with the reference voltage and with a current mirror that generates the bias current and is connected via its control side to the reference output.

8. The differential amplifier according to claim 2, wherein the first amplifier output and the second amplifier output are combined by a converter circuit into a combined output and the combined output is connected to the reference input of the second amplifier.

9. The differential amplifier according to claim 1, wherein a filter is coupled between the first output and the buffer circuit.

10. The differential amplifier according to claim 1, wherein all or some of the transistors are constructed as unipolar transistors.

* * * * *